(12) United States Patent
Kang et al.

(10) Patent No.: US 8,780,617 B2
(45) Date of Patent: Jul. 15, 2014

(54) SEMICONDUCTOR MEMORY DEVICE AND METHOD OF PERFORMING BURN-IN TEST ON THE SAME

(71) Applicants: Sang-beom Kang, Hwaseong-si (KR); Joon-hyung Lee, Hwaseong-si (KR)

(72) Inventors: Sang-beom Kang, Hwaseong-si (KR); Joon-hyung Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 15 days.

(21) Appl. No.: 13/653,782

(22) Filed: Oct. 17, 2012

(65) Prior Publication Data

US 2013/0148405 A1   Jun. 13, 2013

(30) Foreign Application Priority Data

Dec. 8, 2011   (KR) .................. 10-2011-0131113

(51) Int. Cl.
| G11C 11/16 | (2006.01) |
| G11C 11/02 | (2006.01) |
| G11C 7/00 | (2006.01) |
| G11C 7/12 | (2006.01) |
| G11C 8/08 | (2006.01) |
| G11C 8/10 | (2006.01) |
| G11C 29/08 | (2006.01) |
| G11C 16/10 | (2006.01) |
| G11C 29/34 | (2006.01) |
| G11C 8/12 | (2006.01) |

(52) U.S. Cl.
CPC .............. *G11C 29/08* (2013.01); *G11C 16/10* (2013.01); *G11C 29/34* (2013.01); *G11C 11/16* (2013.01); *G11C 8/08* (2013.01); *G11C 8/10* (2013.01); *G11C 8/12* (2013.01)

USPC . 365/158; 365/171; 365/189.16; 365/189.09; 365/189.11; 365/230.06

(58) Field of Classification Search
CPC ............... G11C 11/16; G11C 11/1675; G11C 11/5607; G11C 29/08; G11C 16/10; G11C 29/30; G11C 29/34; G11C 13/0069; G11C 8/08; G11C 8/10; G11C 11/4085; G11C 8/12
USPC ................. 365/148, 163, 158, 171, 173, 201, 365/189.09, 189.11, 191, 230.06
See application file for complete search history.

(56) References Cited

U.S. PATENT DOCUMENTS 5,452,253 A * 9/1995 Choi .............................. 365/201
7,936,594 B2 * 5/2011 Park et al. ..................... 365/163

(Continued)

FOREIGN PATENT DOCUMENTS

JP   09-320296 A   12/1997
JP   2004-055001 A   2/2004

(Continued)

*Primary Examiner* — Ly D Pham
(74) *Attorney, Agent, or Firm* — Lee & Morse, P.C.

(57) ABSTRACT

A semiconductor memory device includes a cell array having a plurality of memory cells, each memory cell including a resistive element and a cell transistor between a bit line and a source line, and a source line voltage supply unit configured to supply, in a normal mode, a reference source line voltage to the source line, and in a test mode, a first source line voltage to the source line when data in a first state is recorded and a second source line voltage to the source line when data in a second state is recorded, the first source line voltage being lower than the reference source line voltage, and the second source line voltage being higher than the reference source line voltage.

16 Claims, 11 Drawing Sheets

(56) References Cited

U.S. PATENT DOCUMENTS

2010/0214834 A1* 8/2010 Hidaka ..................... 365/171
2013/0114326 A1* 5/2013 Lee ........................... 365/148
2013/0301335 A1* 11/2013 Ong ........................... 365/148

FOREIGN PATENT DOCUMENTS

| JP | 2009-211792 A | 9/2009 |
| KR | 10-2003-0053972 A | 7/2003 |

* cited by examiner

|  | WL | | BL | | SL |
|---|---|---|---|---|---|
|  | SEL | UNSEL | SEL | UNSEL | |
| Data '0' | Vs | 0 | Vw1 | Vw2 | Vw2 |
| Data '1' | Vs | 0 | Vw3 | Vw2 | Vw2 |

FIG. 5
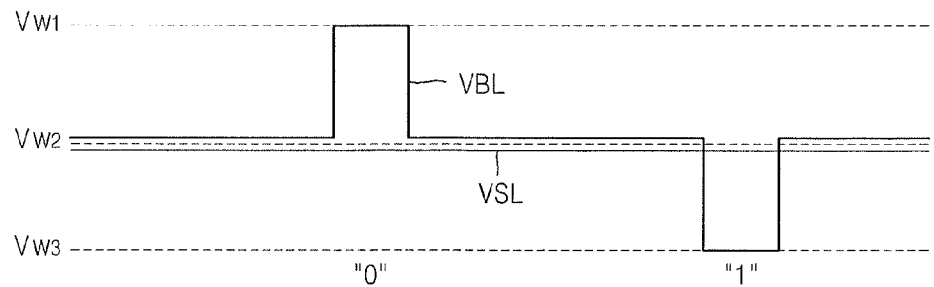
FIG. 6
|  | WL | | BL | | SL |
|---|---|---|---|---|---|
|  | SEL | UNSEL | SEL | UNSEL | |
| Data '0' | $V_s$ | 0 | $V_{W1}$ | $V_{W2}-\Delta$ | $V_{W2}-\Delta$ |
| Data '1' | $V_s$ | 0 | $V_{W3}$ | $V_{W2}+\Delta$ | $V_{W2}+\Delta$ |
FIG. 7
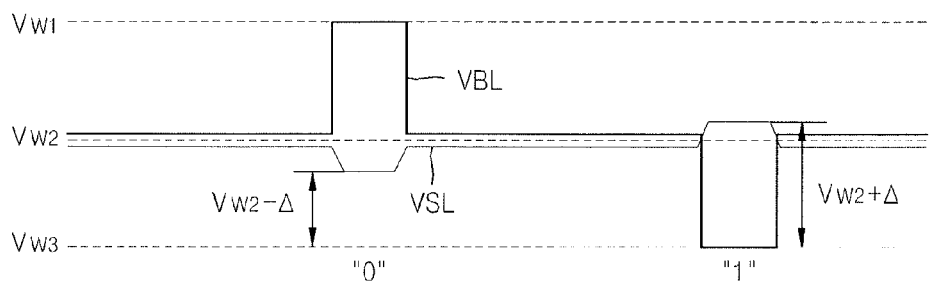

|  | WL | | BL | | SL0 | SL1 |
|---|---|---|---|---|---|---|
|  | Even | Odd | SEL | UNSEL | | |
| Data '0' | $V_S$ | 0 | $V_{W1}$ | $V_{W2}-\Delta$ | $V_{W2}-\Delta$ | $V_{W2}$ |
| Data '1' | $V_S$ | 0 | $V_{W3}$ | $V_{W2}+\Delta$ | $V_{W2}+\Delta$ | $V_{W2}$ |

(b)

|  | WL | | BL | | SL0 | SL1 |
|---|---|---|---|---|---|---|
|  | Even | Odd | SEL | UNSEL | | |
| Data '0' | 0 | $V_S$ | $V_{W1}$ | $V_{W2}-\Delta$ | $V_{W2}$ | $V_{W2}-\Delta$ |
| Data '1' | 0 | $V_S$ | $V_{W3}$ | $V_{W2}+\Delta$ | $V_{W2}$ | $V_{W2}+\Delta$ |

SEMICONDUCTOR MEMORY DEVICE AND METHOD OF PERFORMING BURN-IN TEST ON THE SAME

CROSS-REFERENCE TO RELATED APPLICATIONS

This application claims the benefit under 35 U.S.C §119 of Korean Patent Application No. 10-2011-0131113, filed on Dec. 8, 2011, in the Korean Intellectual Property Office, the disclosure of which is incorporated herein in its entirety by reference.

BACKGROUND

1. Field

The inventive concept relates to a burn-in test performed on a semiconductor memory device, and more particularly, to a semiconductor memory device and a method of performing a burn-in test on the semiconductor memory device, such as a resistive memory, by adjusting operating conditions.

2. Description of the Related Art

A semiconductor memory device, which is a device for storing information, may be classified into a volatile memory device and a nonvolatile memory device. Examples of the nonvolatile memory device include a phase-change random access memory (PRAM) using a phase-change material, a resistive random access memory (RRAM) using a variable resistance material such as a transition complex metal oxide, a magnetic random access memory (MRAM) using a ferromagnetic material, and a ferroelectric random access memory (FRAM) using a ferroelectric capacitor. In the field of memory devices, various researches have been conducted to improve performance, for example, an integration degree, an operating speed, and data reliability.

However, performance may be degraded due to various factors such as a variation in a process of manufacturing a semiconductor device or a variation in signals applied to various circuits for operating the semiconductor memory device. Accordingly, a burn-in test is performed on the semiconductor memory device to detect defects during manufacture and mismatch between design and reality. Once a failure is detected by the burn-in test, failure analysis is performed in order to determine the cause of the failure. By using the burn-in test and the failure analysis, the throughput of the semiconductor memory device may be improved.

The burn-in test is performed by operating the semiconductor memory device at a higher temperature and a higher voltage than those during normal operation. As the semiconductor memory device is more stressed for a short time than during a normal operation, an early detection of a memory cell with a risk of malfunction may be possible before the semiconductor memory device is placed in service.

SUMMARY

The inventive concept provides a semiconductor memory device and a method of performing a burn-in test on the semiconductor memory device by reducing a burn-in test time and setting various operating conditions.

According to an aspect of the inventive concept, there is provided a semiconductor memory device including a cell array having a plurality of memory cells, each memory cell including a resistive element and a cell transistor between a bit line and a source line, and a source line voltage supply unit configured to supply a reference source line voltage, a first source line voltage, and a second source line voltage, wherein, in a normal mode, the source line voltage supply unit supplies the reference source line voltage to the source line, wherein, in a test mode, the source line voltage supply unit supplies the first source line voltage to the source line when data in a first state is recorded and the second source line voltage to the source line when data in a second state is recorded, and wherein the first source line voltage is lower than the reference source line voltage, and the second source line voltage is higher than the reference source line voltage.

The memory cells may include magnetic tunnel junction (MTJ) cells.

The test mode may be a burn-in test mode.

The cell array may include a plurality of regions, the source line voltage supply unit being configured to supply source line voltages having different levels to the plurality of regions in the test mode.

In the test mode, the source line voltage supply unit may supply source line voltages having a same level to the plurality of memory cells of the cell array.

The semiconductor memory device may further include a row decoder configured to drive a word line connected to the memory cell in response to a first select signal, a column decoder configured to select the bit line in response to a second select signal, and a burn-in test decoder that, in the test mode, is configured to generate the first and second select signals for testing the memory cells.

All of the plurality of memory cells of the cell array may be simultaneously selected in response to the first and second select signals.

The cell array may include a plurality of regions, memory cells of the plurality of regions may be sequentially selected in response to the first and second select signals.

The source line voltage supply unit may include a first voltage generator configured to output the reference source line voltage, a second voltage generator configured to output the first source line voltage or the second source line voltage according to a data write state, and a switching unit configured to selectively supply any one of outputs of the first and second voltage generators to the source line in response to a test operation signal.

The source line voltage supply unit may include a voltage divider configured to generate a plurality of divided voltages through voltage division, and to output any one divided voltage in response to a test operation signal and at least one control signal, and a voltage controller configured to receive the divided voltage, to output a source line voltage to the source line, and to adjust and output the source line voltage according to a level difference between the divided voltage and the source line voltage.

According to another aspect of the inventive concept, there is provided a semiconductor memory including a cell array having a plurality of memory cells, each memory cell including a resistive element and a cell transistor between a bit line and a source line, a bit line voltage supply unit configured to supply a bit line voltage to the bit line, and a source line voltage supply unit configured to supply a source line voltage to the source line, wherein, in a normal mode, the bit line voltage and the source line voltage having a first level difference therebetween are supplied to the cell array in order to write data in a first state to the memory cell, and in a test mode, the bit line voltage and the source line voltage having a second level difference therebetween are supplied to the cell array in order to write data in the first state to the memory cell.

In the normal mode, the bit line voltage and the source line voltage having a third level difference therebetween may be supplied to the cell array in order to write data in a second state to the memory cell, and in the test mode, the bit line voltage and the source line voltage having a fourth level difference therebetween may be supplied to the cell array in order to write data in the second state to the memory cell.

The source line voltage supply unit may be configured to generate source line voltages having different levels in the normal mode and in the test mode.

The plurality of memory cells of the cell array may be simultaneously selected in the test mode, and the second level difference in the test mode is larger than the first level difference in the normal mode.

According to another aspect of the inventive concept, there is provided a method of performing a burn-in test on a semiconductor memory device having a cell array with a plurality of memory cells, each of the memory cells including a resistive element, the method including entering a burn-in test mode in response to a test operation signal, selecting at least one memory cell of the cell array by using a burn-in test decoder, supplying a first source line voltage lower than a reference source line voltage to a source line, such that data in a first state is written to the at least one selected memory cell, and supplying a second source line voltage higher than the reference source line voltage to the source line, such that data in a second state is written to the at least one selected memory cell.

In a normal mode, the reference source line voltage may be supplied to the source line in order to write data in the first state and the second state.

The method may further include, when the semiconductor memory device operates in a normal mode, commonly supplying the reference source line voltage to the plurality of memory cells of the cell array through the source line.

The memory cells may include MTJ cells.

The plurality of memory cells of the cell array may be simultaneously selected by using the burn-in test decoder.

The cell array may include a plurality of regions, the plurality of regions of the cell array being sequentially selected in the burn-in test mode by using the burn-in test decoder.

BRIEF DESCRIPTION OF THE DRAWINGS

Features will become apparent to those of ordinary skill in the art by describing in detail exemplary embodiments with reference to the attached drawings, in which:

FIG. 5 illustrates a timing diagram of a waveform of a voltage applied to a bit line and a waveform of a voltage applied to a source line according to the levels of the voltages shown in the table of FIG. 4;

FIG. 6 illustrates a table showing levels of voltages when the semiconductor memory device of FIG. 1 operates in a burn-in test mode;

FIG. 7 illustrates a timing diagram showing a waveform of a voltage applied to the bit line and a waveform of a voltage applied to the source line according to the levels of the voltages shown in the table of FIG. 6;

FIG. 12 illustrates a table showing levels of voltages when the semiconductor memory device of FIG. 11 operates in a burn-in test mode;

DETAILED DESCRIPTION

Figure 1:
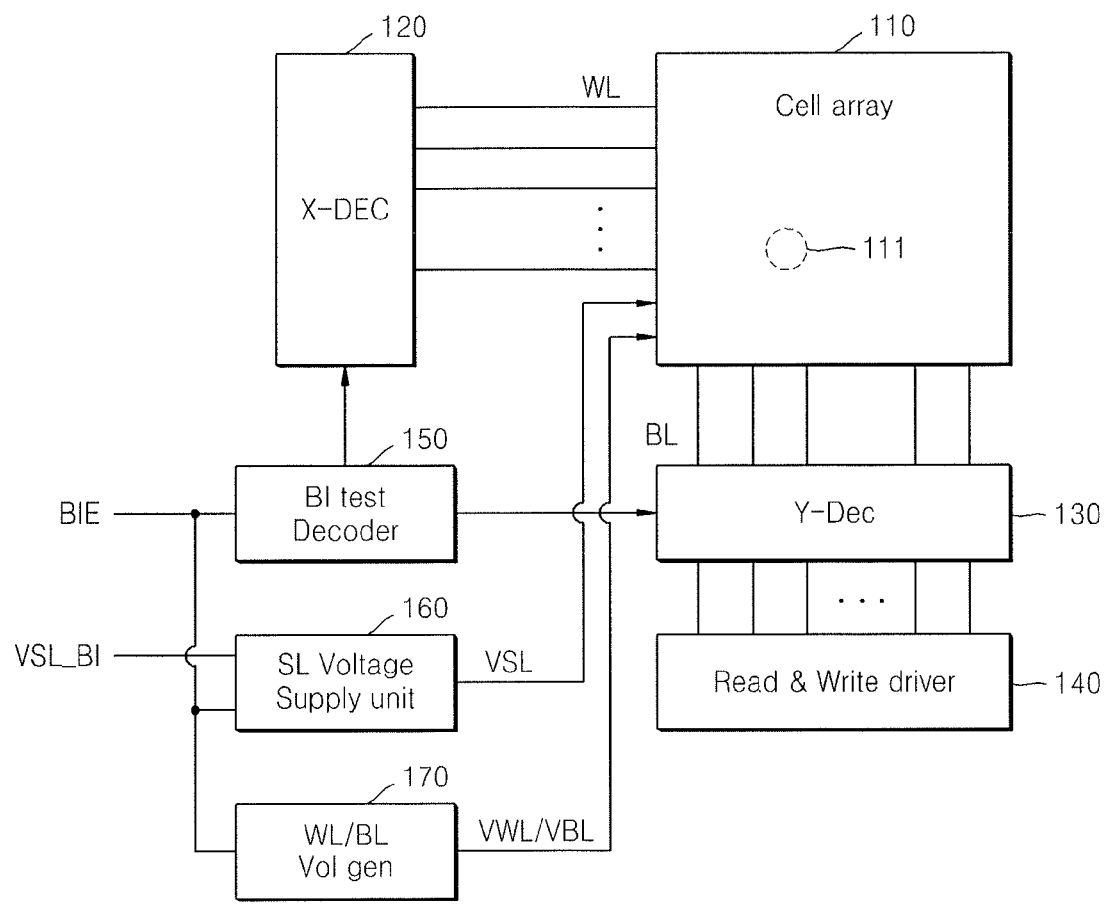
FIG. 1 illustrates a block diagram of a semiconductor memory device according to an embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a block diagram of a semiconductor memory device 1000 according to an embodiment of the inventive concept. In general, in order to ensure the reliability of a semiconductor memory device, a burn-in test is performed before or after chips are packaged. A burn-in test for determining strengths of memory cells stored in a same chip may be performed by supplying a voltage higher than an external supply voltage or an internal supply voltage to the memory cells for a short time to apply stress to the memory cells. By using the burn-in test, it may be determined whether the memory cells are in a good state or a bad state.

Referring to FIG. 1, the semiconductor memory device 1000 may include a cell array 110, a row decoder 120, a column decoder 130, a write and read circuit 140, a burn-in (BI) test decoder 150, a source line (SL) voltage supply unit 160, and a word line/bit line (WL/BL) voltage generating unit 170.

Each of the row decoder 120, i.e., X-Dec 120, and the column decoder 130, i.e., Y-Dec 130, includes a plurality of switches based on metal-oxide semiconductor (MOS) transistors. The row decoder 120 selects at least one of word lines WL in response to a row address, and the column decoder 130 selects at least one of bit lines BL in response to a column address. The cell array 110 includes a plurality of memory cells 111 formed at intersections between the word lines WL and the bit lines BL.

The memory cells 111 may include resistive memory cells having nonvolatile characteristics. In this case, each of the memory cells 111 has a high resistance value or a low resistance value according to written data. When data is read, data voltages having different levels are generated according to the resistance value and are supplied to the write and read circuit 140. The write and read circuit 140 includes a plurality of sense amplifier circuits for sensing and amplifying a data voltage, and outputs a data signal having a digital level based on the data voltage.

The burn-in test decoder 150 may enable all of the memory cells 111 by selecting all of the word lines WL and the bit lines BL or may enable memory cells of a specific region by selecting at least one of the word lines WL and the bit lines BL in a burn-in test mode according to a test operation signal BIE. For example, when all of the memory cells 111 of the cell array 110 are enabled, the burn-in test decoder 150 commonly applies signals having the same level to all drivers (not shown) in the row decoder 120 for driving the word lines WL, and commonly applies signals to the switches (not shown) in the column decoder 130 to simultaneously turn on the switches.

The cell array 110 may include at least two regions, and a burn-in test may be selectively performed in the two regions. In this case, the burn-in test decoder 150 may apply signals for enabling only some of the word lines WL, i.e., while disabling other word lines, to the row decoder 120, or may apply signals for selectively turning on only some of the switches to the column decoder 130.

The test operation signal BIE may be input from the outside of the semiconductor memory device 1000, or may be generated in a logic circuit (not shown) in the semiconductor memory device 1000. When a burn-in test is performed on the semiconductor memory device 1000 by using an external tester (not shown), the test operation signal BIE may be generated from the external tester and may be applied to the semiconductor memory device 1000. Alternatively, the semiconductor memory device 1000 may include a mode register set (MRS, not shown) for setting an operation mode. The MRS may output the test operation signal BIE, so that the semiconductor memory device 1000 may enter a burn-in test mode.

The source line voltage supply unit 160 adjusts and supplies a voltage applied to a source line in response to the test operation signal BIE. That is, when the semiconductor memory device 1000 performs a read operation or a write operation in a normal mode, the source line voltage supply unit 160 supplies a source line voltage VSL having a predetermined level, and when the semiconductor memory device 1000 enters a burn-in test mode, the source line voltage supply unit 160 supplies the source line voltage VSL having a level different from the level of the source line voltage VSL in the normal mode. In this case, the source line voltage supply unit 160 may receive a source line voltage for burn-in test VSL_BI from the outside and supply the source line voltage for burn-in test VSL_BI into the semiconductor memory device 1000, or may include a voltage generator for burn-in test (not shown) therein and may directly generate the source line voltage for burn-in test VSL_BI.

The word line/bit line voltage generating unit 170 generates word line/bit line voltages VWL/VBL respectively supplied to the word lines WL and the bit lines BL. Also, the word line/bit line voltage generating unit 170 generates word line/bit line voltages for burn-in test in response to the test operation signal BIE. The levels of the word line/bit line voltage in the normal mode may be different from those in the burn-in test mode.

Figure 2:
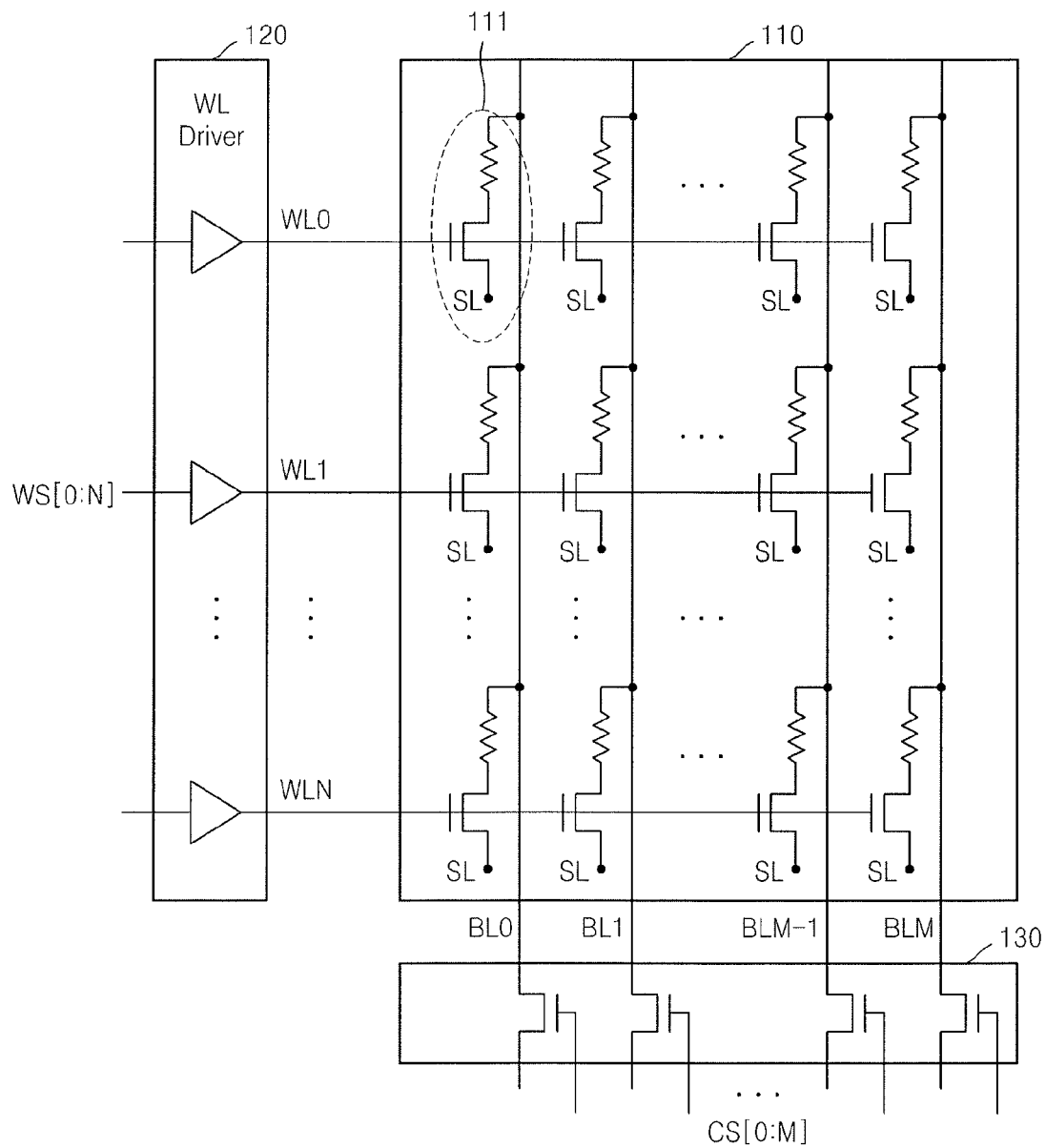
FIG. 2 illustrates a circuit diagram of a cell array of the semiconductor memory device of FIG. 1.
Figures 3, 4:
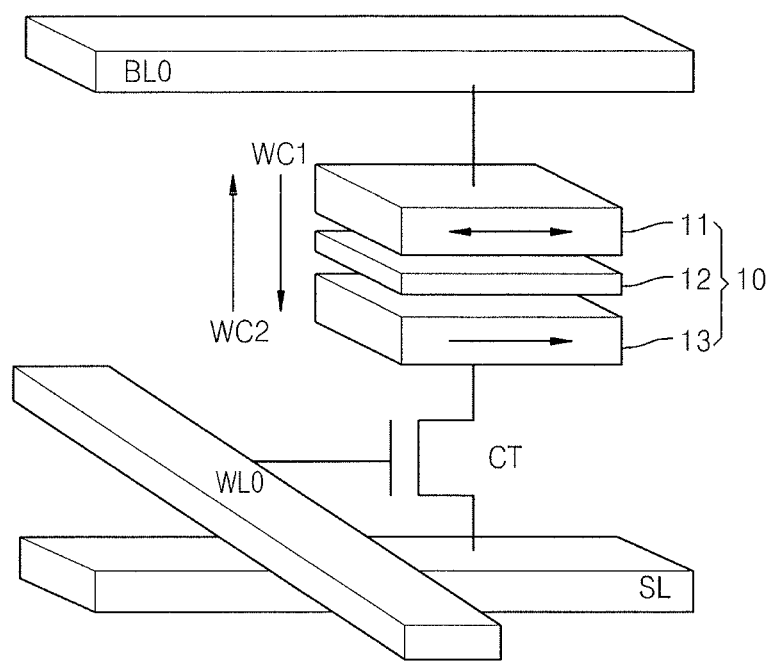
FIG. 3 illustrates an exploded perspective view of a spin torque transfer torque magneto-resistive random access memory (STT-MRAM) which is a nonvolatile memory cell of the cell array of FIG. 2.
FIG. 4 illustrates a table showing levels of voltages when the semiconductor memory device of FIG. 1 performs a write operation in a normal mode.

FIG. 2 is a circuit diagram illustrating the cell array 110 of the semiconductor memory device 1000 of FIG. 1. FIG. 3 is an exploded perspective view illustrating a spin transfer torque magneto-resistive random access memory (STT-MRAM), which is each of the memory cells 111 of the cell array 110 of FIG. 2.

Referring to FIG. 2, the cell array 110 may include a plurality of word lines WL0 through WLN (where N is a natural number equal to or greater than 1), a plurality of bit lines BL0 through BLM (where M is a natural number equal to or greater than 1), and the plurality memory cells 111 disposed at intersections between the word lines WL0 through WLN and the bit lines BL0 through BLM. When the cell array 110 is a resistive memory, each of the memory cells 111 may include a cell transistor and a resistive element. The cell transistor is switched in response to a signal output from the row decoder 120. Also, the cell transistor and the resistive element of each of the memory cells 111 are connected between a source line SL and any one of the bit lines BL0 through BLM. Although not shown in FIG. 2, the plurality of memory cells 111 may be commonly connected to the same source line SL.

The burn-in test decoder 150 of FIG. 1 outputs select signals for selecting at least one of the memory cells 111 of the cell array 110. For example, the burn-in test decoder 150 generates a word line select signal WS[0:N] for selecting at least one of the word lines WL0 through WLN and applies the word line select signal WS[0:N] to the row decoder 120, and generates a column select signal CS[0:M] for selecting at least one of the bit lines BL0 through BLM and applies the column select signal CS[0:M] to the column decoder 130. When all of the memory cells 111 of the cell array 110 are selected, the word line select signals WS[0:N] may have the same level and the column select signals CS[0:M] may have the same level.

The resistive element may be a phase-change random access memory (PRAM) using a phase-change material, a resistive random access memory (RRAM) using a variable resistance material such as a transition complex metal oxide, and a magnetic random access memory (MRAM) using a ferromagnetic material. A material used to form the resistive element has a resistance value that varies according to a magnitude and/or a direction of a current or a voltage, and has nonvolatile characteristics to maintain the resistance value even when the current or the voltage is cut off.

Referring to FIG. 3, each of the memory cells 111 which is, e.g., a STT-MRAM, may include a magnetic tunnel junction (MTJ) cell 10 and a cell transistor CT. A gate of the cell transistor CT is connected to a word line (for example, a first word line WL0), one electrode of the cell transistor CT is connected to a bit line (for example, a first bit line BL0) through the MTJ cell 10, and another electrode of the cell transistor CT is connected to the source line SL.

The MTJ cell 10 may include a fixed layer 13, a free layer 11, and a tunnel layer 12 disposed between the fixed layer 13 and the free layer 11. A magnetization direction of the fixed layer 13 may be fixed, and a magnetization direction of the free layer 11 may be the same as or opposite to the magnetization direction of the fixed layer 13 according to conditions. In order to fix a magnetization direction of the fixed layer 13, each of the memory cells 111 may further include an anti-ferromagnetic layer (not shown).

A resistance value of the MTJ cell 10 varies according to a magnetization direction of the free layer 11, and data whose state varies according to the resistance value is stored. In this case, when a magnetization direction of the free layer 11 is the same as a magnetization direction of the fixed layer 13, the MTJ cell 10 may have a low resistance value and store data in a first state (for example, data '0'). Also, when a magnetization direction of the free layer 11 is opposite to a magnetization direction of the fixed layer 13, the MTJ cell 10 may have a high resistance value and store data in a second state (for example, data '1'). Although the free layer 11 and the fixed layer 13 of the MTJ cell 10 are horizontal magnetic elements in FIG. 3, the present embodiment is not limited thereto and the free layer 11 and the fixed layer 13 may be vertical magnetic elements.

In order for the semiconductor memory 1000 including a STT-MRAM to perform a write operation, the cell transistor CT is turned on by supplying a voltage having a logic high level to the first word line WL0 and write currents WC1 and WC2 are induced by supplying a voltage between the first bit line BL0 and the source line SL. In this case, a magnetization direction of the free layer 11 is determined according to directions of the write currents WC1 and WC2.

In order for the semiconductor memory device 1000 including a STT-MRAM to perform a read operation, the cell transistor CT may be turned on by supplying a voltage having a logic high level to the first word line WL0 and data stored in the MTJ cell 10 may be determined by applying a read current from the first bit line BL0 to the source line SL. In this case, an intensity of the read current is much smaller than intensities of the write currents WC1 and WC2, a magnetization direction of the free layer 11 is not changed due to the read current.

FIG. 4 is a table showing levels of various voltages when the semiconductor memory device 1000 of FIG. 1 performs a write operation in a normal mode. FIG. 5 is a timing diagram illustrating a waveform of a voltage applied to the bit line BL and a waveform of a voltage applied to the source line SL according to the levels of the voltages shown in the table of FIG. 4.

Referring to FIGS. 3 and 4, in order to write data in a normal mode, the memory cells 111 are selected. The cell transistor CT is turned on by supplying a logic high voltage $V_S$ to a selected word line SEL WL and the cell transistor CT is turned off by supplying a logic low voltage (for example, a ground voltage) to a unselected word line UNSEL WL. Since the source line SL is commonly connected to all of the memory cells 111 included in the cell array 110, a reference source line voltage $V_{W2}$ is supplied to the source line SL irrespective of whether a memory cell is selected.

In order to write data '0' to the memory cells 111, a first write voltage $V_{W1}$ having a level higher than that of the reference source line voltage $V_{W2}$ is supplied to the bit lines BL. Since the voltage applied to the bit line BL is higher than a voltage applied to the source line SL, the first write current WC1 flows in the MTJ cell 10, i.e., in a direction from the bit line BL toward the source line SL. Therefore, the free layer 11 is magnetized in the same direction as that of the fixed layer 13.

In order to write data '1' to the memory cells 111, a second write voltage $V_{W3}$ having a level lower than that of the reference source line voltage $V_{W2}$ is supplied to the bit lines BL. For example, the second write voltage $V_{W3}$ may be a ground voltage GND. Since the voltage applied to the bit line BL is lower than a voltage applied to the source line SL, the second write current WC2 flows in the MTJ cell 10, i.e., in a direction from the source line SL toward the bit line BL. Therefore, the free layer 11 is magnetized in a direction opposite to that of the fixed layer 13.

As shown in FIG. 5, when data '0' or '1' is written, the reference source line voltage $V_{W2}$ is supplied as a source line voltage VSL, and the first write voltage $V_{W1}$ or the second write voltage $V_{W3}$ is supplied as a bit line voltage VBL according to written data. According to a level difference between the source line voltage VSL and the bit line voltage VBL, data '0' or '1' is written to the memory cells 111.

FIG. 6 is a table showing levels of various voltages when the semiconductor memory device 1000 of FIG. 1 operates in a burn-in test mode. FIG. 7 is a timing diagram illustrating a waveform of a voltage applied to the bit lines BL and a waveform of a voltage applied to the source line SL according to the levels of the voltages shown in the table of FIG. 6.

A burn-in test is performed by operating a semiconductor memory device at a higher temperature and a higher voltage than those during normal operation. The semiconductor memory device is more stressed for a short time as compared to normal operation, thereby making it possible to detect a memory cell with the risk of malfunction early, e.g., before the semiconductor memory device is placed in service.

In a burn-in test mode, in order to write data, the memory cells 111 are selected. The cell transistor CT is turned on by supplying the logic high voltage $V_S$ to the selected word line SEL WL, and the cell transistor CT is turned off by supplying a logic low voltage (for example, a ground voltage GND) to the unselected word line UNSEL WL. When the source line SL is commonly connected to all of the memory cells 111 of the cell array 110, the source line voltages VSL having the same level are supplied to the source line SL irrespective of whether a memory cell is selected.

As described above, according to the present embodiment, all of the memory cells 111 of the cell array 110 may be selected and simultaneously tested, or the cell array 110 may be divided into at least two regions and only the memory cells 111 included in the corresponding region may be selected. When a burn-in test is performed according to regions, voltages under conditions as shown in FIG. 6 may be supplied to the memory cells 111 of a selected region. Also, regions of the cell array 110 may be connected to different source lines SL and the source line voltages VSL having different levels may be supplied to the regions. In this case, the source line voltage supply unit 160 of the semiconductor memory device 1000 of FIG. 1 may generate two or more source line voltages VSLs, and may supply a source line voltage as shown in FIG. 6 to the source line SL of a selected region and voltages (for example, the reference source line voltages $V_{W2}$) having different levels to the source lines SL of unselected regions.

When the cell array 110 is divided into at least two regions, the plurality of word lines WL may be divided into two groups, e.g., even word lines and odd word lines, and a test may be sequentially performed according to regions. Alternatively, a plurality of bit lines may be divided into two regions, e.g., even bit lines and odd bit lines, and a burn-in test may be sequentially performed according to the regions.

In order to perform a burn-in test, the memory cells 111 are driven by applying stress higher than that during the normal mode. For example, a stress higher than stress used to write data '0' in a normal mode may be applied. To this end, the first write voltage $V_{W1}$ is supplied to the selected bit line SEL BL, and a first source line voltage $V_{W2}-\Delta$ having a level lower by a predetermined value than that of the reference source line voltage $V_{W2}$ is supplied to the source line SL. A voltage having the same level as that of the first source line voltage $V_{W2}-\Delta$ may be supplied to the unselected bit line UNSEL BL.

In another example, a stress higher than stress used to write '1' in a normal mode may be applied. To this end, the second write voltage $V_{W3}$ having a low level, e.g., a ground voltage, is supplied to the selected bit line SEL BL. Also, a second source line voltage $V_{W2}+\Delta$ having a level higher by a predetermined value than that of the reference source line voltage $V_{W2}$ is supplied to the source line SL. Also, a voltage having the same level as that of the second source line voltage $V_{W2}+\Delta$ may be supplied to the unselected bit line UNSEL BL. That is, as shown in FIG. 7, when data '0' or '1' is written in a burn-in test mode, a level difference between the bit line voltage VBL and the source line voltage VSL is higher than that in the normal mode shown in FIG. 5. In this manner, a defective cell may be detected by applying a stress higher than that used in a normal mode.

Figure 8:
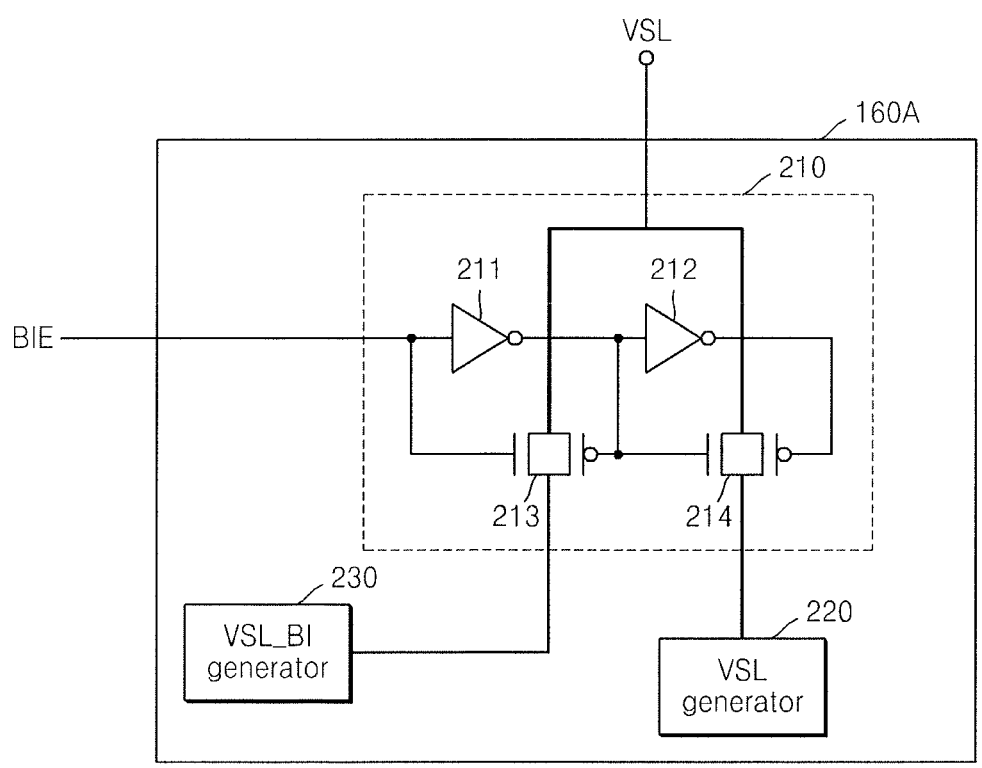
FIG. 8 illustrates a circuit diagram of a source line voltage supply unit according to an embodiment of the inventive concept.

FIG. 8 is a circuit diagram of a source line voltage supply unit 160A according to an embodiment of the inventive concept. Referring to FIG. 8, the source line voltage supply unit 160A may include a switching unit 210, a first voltage generator 220, and a second voltage generator 230.

The source line voltage supply unit 160A receives the test operation signal BIE, and outputs the source line voltages VSL having different levels in response to the test operation signal BIE. The first voltage generator 220 generates the reference source line voltage $V_{W2}$ for a normal mode of the semiconductor memory device 1000 and supplies the reference source line voltage $V_{W2}$ as the source line voltage VSL, and the second voltage generator 230 generates the first and second source line voltages $V_{W2}-\Delta$ and $V_{W2}+\Delta$ for a burn-in test and supplies the first and second source line voltages $V_{W2}-\Delta$ and $V_{W2}+\Delta$ as the source line voltage VSL. Voltages generated by the first and second voltage generators 220 and 230 are supplied to the switching unit 210.

The switching unit 210 includes one or more switches. For example, the switching unit 210 may include a first inverter 211, a second inverter 212, a first transmission gate 213, and a second transmission gate 214. The switching unit 210 selectively outputs voltage from the first voltage generator 220 when the semiconductor memory device 1000 operates in a normal mode, and selectively outputs voltage from the second voltage generator 230 when the semiconductor memory device 1000 operates in a burn-in test mode.

When the test operation signal BIE has a high level, an N-channel MOS (NMOS) transistor of the first transmission gate 213 receives a logic high signal as a gate voltage and is turned on, and a P-channel MOS (PMOS) transistor of the first transmission gate 213 receives a logic low signal obtained by the first inverter 211 as a gate voltage and is turned on. Accordingly, the switching unit 210 selectively outputs voltage from the second voltage generator 230 and supplies the voltage as the source line voltage VSL.

When the test operation signal BIE has a low level, the NMOS transistor of the first transmission gate 213 receives a logic low signal as a gate voltage and is turned off, and the PMOS transistor of the first transmission gate 213 receives a logic high signal obtained by the first inverter 211 as a gate voltage and is turned off. Also, an NMOS transistor of the second transmission gate 214 receives a logic high signal obtained by the first inverter 211 as a gate voltage and is turned on, and a PMOS transistor of the second transmission gate 214 receives a logic low signal obtained by the second inverter 211 as a gate voltage and is turned on. Accordingly, the switching unit 210 selectively outputs a voltage from the first voltage generator 220 and supplies the voltage as the source line voltage VSL.

The source line voltage for burn-in test VSL_BI may be supplied from the outside as described above. In this case, the second voltage generator 230 of FIG. 8 may not be included in the source line voltage supply unit 160A. That is, in a burn-in test mode, the first source line voltage $V_{W2}-\Delta$ supplied from the outside when data '0' is written may be supplied through the switching unit 210 to the source line SL, and the second source line voltage $V_{W2}+\Delta$ supplied from the outside when data '1' is written may be supplied through the switching unit 210 to the source line SL.

Figure 9:
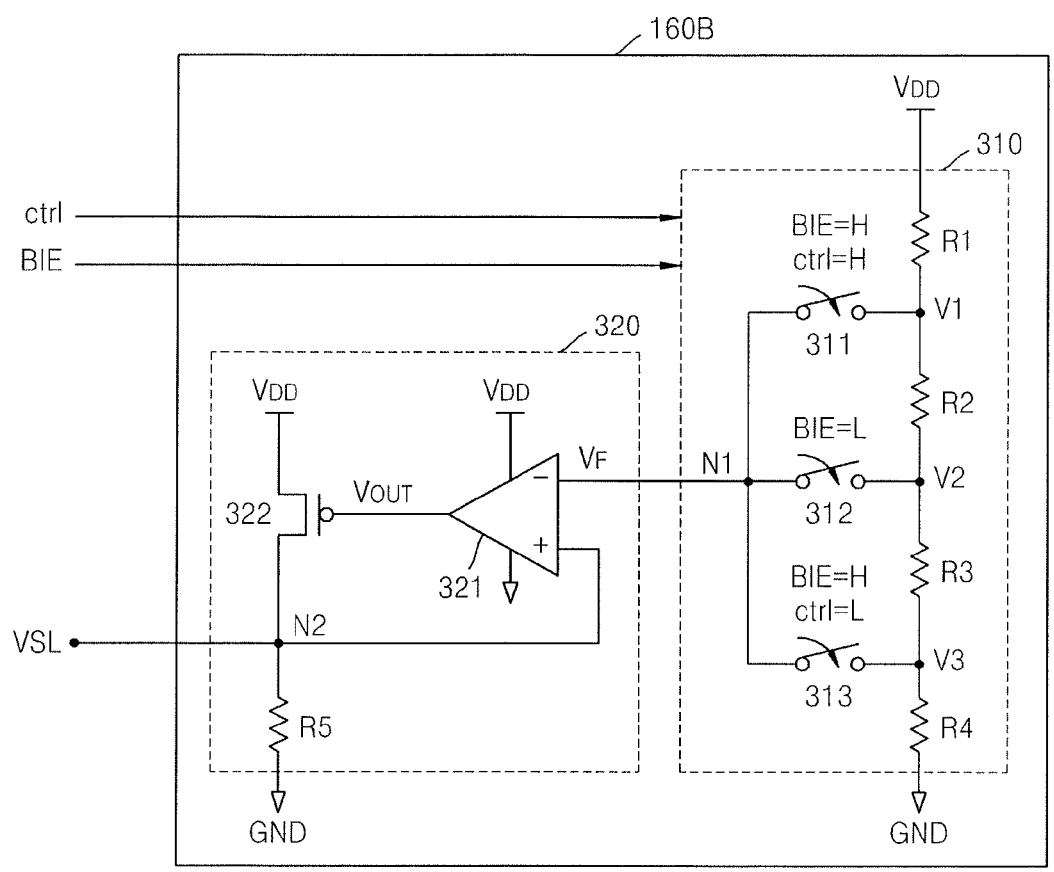
FIG. 9 illustrates a circuit diagram of a source line voltage supply unit according to another embodiment of the inventive concept.

FIG. 9 is a circuit diagram illustrating a source line voltage supply unit 160B according to another embodiment of the inventive concept. Referring to FIG. 9, the source line voltage supply unit 160B may include a voltage divider 310 and a voltage controller 320.

The voltage divider 310 may include a plurality of resistors that are arranged in series and one or more switches that are connected to the plurality of resistors. For example, as shown in FIG. 9, the plurality of resistors may include first through fourth resistors R1, R2, R3, and R4, and the one or more switches may include first through third switches 311, 312, and 313. A voltage is supplied to both ends of the first through fourth resistors R1 through R4 that are arranged in series. For example, a power supply voltage $V_{DD}$ may be supplied, e.g., connected, to the first resistor R1, and the ground voltage GND may be supplied, e.g., connected, to the fourth resistor R4. The first switch 311 is connected to a node between the first resistor R1 and the second resistor R2, the second switch 312 is connected to a node between the second resistor R2 and the third resistor R3, and the third switch 313 is connected to a node between the third resistor R3 and the fourth resistor R4. Also, one end of each of the first through third switches 311, 312, and 313 may be commonly connected to a first node N1.

When the first switch 311 is turned on, a first voltage V1 is output through the first node N1. When the second switch 312 is turned on, a second voltage V2 is output through the first node N1. When the third switch 313 is turned on, a third voltage V3 is output through the first node N1. The first through third voltages V1 through V3 are expressed as follows, $$V1 = ((R2+R3+R4)/R_\tau) \cdot V_{DD} \qquad \text{Equation (1)}$$

$$V2 = ((R3+R4)/R_\tau) \cdot V_{DD} \qquad \text{Equation (2)}$$

$$V3 = (R4/R3) \cdot V_{DD} \qquad \text{Equation (3)}$$

It is noted that in Equations 1-3, $R_\tau = R1+R2+R3+R4$. That is, a sum of resistance values of all of the first through fourth resistors R1, R2, R3, and R4, and $V_{DD}$ is a power supply voltage.

The first through third switches 311, 312, and 313 may be controlled to be switched by the test operation signal BIE and at least one control signal Ctrl. For example, during a normal operation, the test operation signal BIE having a low level is input to the voltage divider 310. In response to the test operation signal BIE, the first and third switches 311 and 313 are turned off, the second switch 312 is turned on, and the second voltage V2 which is a voltage between the second resistor R2 and the third resistor R3 is output to the voltage controller 320 through the first node N1. In this case, the second voltage V2 is a reference source line voltage.

During a burn-in test operation, in order to supply a voltage higher than an actually used voltage while writing data '0', the test operation signal BIE having a high level and the control signal Ctrl having a first level (for example, a logic low level) are input to the voltage divider 310. In response to the input signals, the first and second switches 311 and 312 are turned off, the third switch 313 is turned on, and the third voltage V3, which is a voltage between the third resistor R3 and the fourth resistor R4, is output to the voltage controller 320 through the first node N1. In this case, the third voltage V3 has a level lower than that of a reference source line voltage, e.g., a level corresponding to that of the first source line voltage $V_{W2}-\Delta$.

Also, during a burn-in test operation, in order to supply a voltage higher than an actually used voltage while writing data '1', the test operation signal BIE having a high level and the control signal Ctrl having a high level are input to the voltage divider 310. In response to the input signals, the second and third switches 312 and 313 are turned off, the first switch 311 is turned on, and the first voltage V1, which is a voltage between the first resistor R1 and the second resistor R2, is output to the voltage controller 320 through the first node N1. In this case, the first voltage V1 has a level higher than that of a reference source line voltage, e.g., a level corresponding to that of the second source line voltage $V_{W2}+\Delta$.

Although the test operation signal BIE and the control signal Ctrl are used as signals for controlling the first through third switches 311, 312, and 313 in FIG. 9, the present embodiment is not limited thereto. For example, since the first through third switches 311, 312, and 313 are switched according to data to be written, the first through third switches 311, 312, and 313 may be controlled to be switched according to a combination of the test operation signal BIE and the data instead of the control signal Ctrl.

The voltage controller 320 may include a comparator 321, a PMOS transistor 322, and a fifth resistor R5. When voltage output through the first node N1 is referred to as a divided voltage $V_F$, the comparator 321 includes a first input terminal (for example, an inverting terminal) receiving the divided voltage $V_F$ output from the voltage divider 310, and a second input terminal (for example, a non-inverting terminal) connected to a second node N2 between the PMOS transistor 322 and the fifth resistor R5. In this case, voltage of the second node N2 is the source line voltage VSL output from the source line voltage supply unit 160B.

A drain of the PMOS transistor 322 is connected to the second node N2, a gate of the PMOS transistor 322 is connected to an output terminal of the comparator 321, and the power supply voltage $V_{DD}$ is supplied to a source of the PMOS transistor 322. The fifth resistor R5 is connected to the second node N2, and the ground voltage GND is supplied to the fifth resistor R5.

The comparator 321 supplies an output voltage $V_{OUT}$ to the gate of the PMOS transistor 322 in response to the source line voltage VSL and the divided voltage $V_F$. In this case, when the source line voltage VSL input to the non-inverting terminal (+) is lower than the divided voltage $V_F$ input to the inverting terminal (−), the comparator 321 supplies the output voltage $V_{OUT}$ having a logic low level to the gate of the PMOS transistor 322. The PMOS transistor 322 is turned on due to the output voltage $V_{OUT}$ having the logic low level, and a voltage of the second node N2 connected to the drain of the PMOS transistor 322 is increased. As the voltage of the second node N2 is increased, the source line voltage VSL input to the non-inverting terminal (−) of the comparator 321 is also increased.

On the other hand, when the source line voltage VSL input to the non-inverting terminal (+) is higher than the divided voltage $V_F$ input to the inverting terminal (−), the comparator 321 supplies the output voltage $V_{OUT}$ having a high level to the gate of the PMOS transistor 322. The PMOS transistor 322 is turned off due to the output voltage $V_{OUT}$ having the high level, and a voltage of the second node N2 connected to the drain of the PMOS transistor 322 is decreased. As the voltage of the second node N2 is decreased, the source line voltage VSL input to the non-inverting terminal (−) of the comparator 321 is also decreased.

By using the above feed-back process, the divided voltage $V_F$ and the source line voltage VSL are stabilized to be the same. That is, the source line voltage supply unit 160B outputs the source line voltage VSL that is the same as the divided voltage $V_F$ obtained by the voltage divider 310 in response to the control signal Ctrl and the test operation signal BIE.

Figure 10:
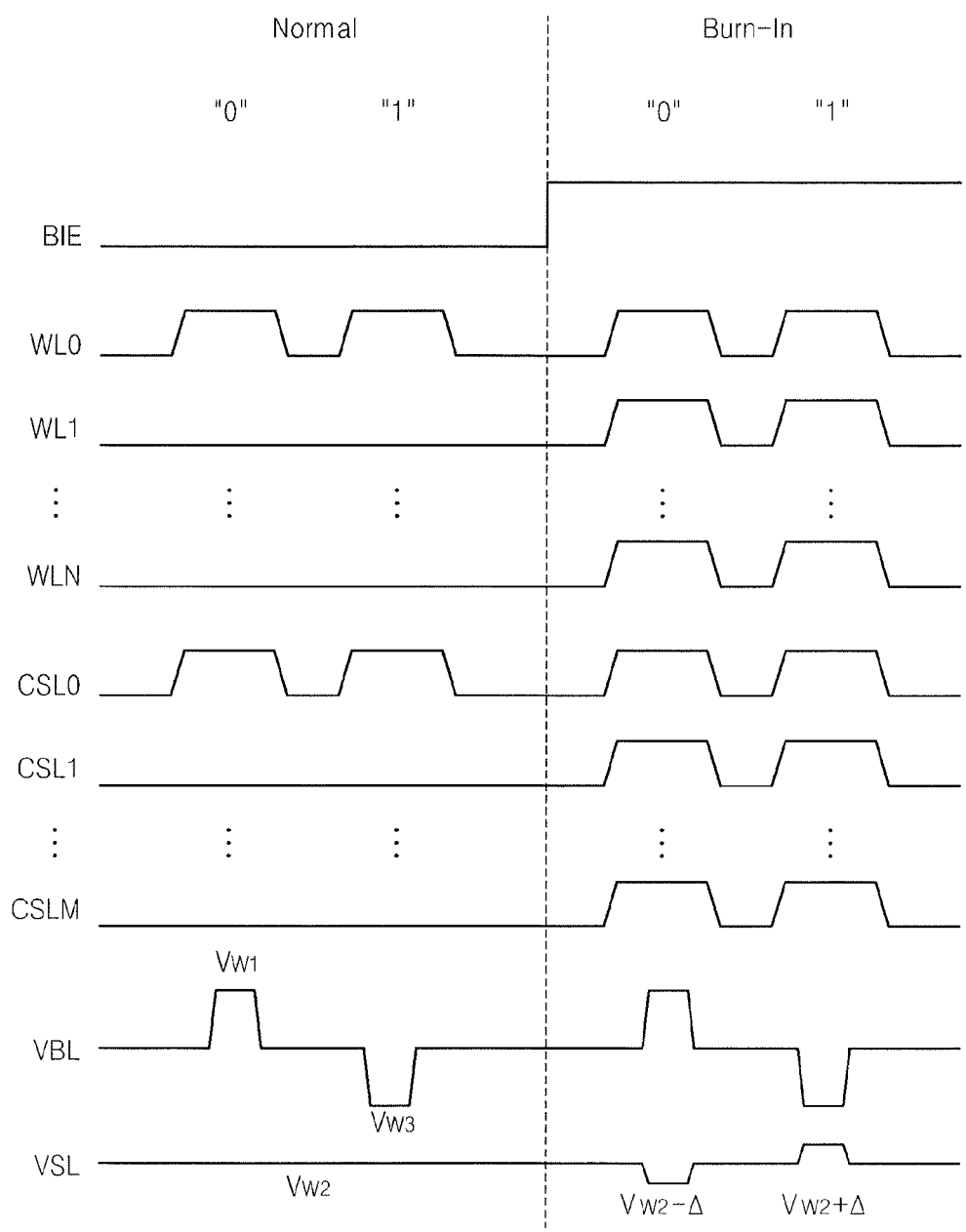
FIG. 10 illustrates a timing diagram of a waveform of a signal when the semiconductor memory device of FIG. 1 performs a write operation in a normal mode and a test mode.

FIG. 10 is a timing diagram illustrating a waveform of a signal when the semiconductor memory device 1000 of FIG. 1 performs a write operation in a normal mode and a burn-in test mode.

Referring to FIGS. 1, 2, and 10, when the semiconductor memory device 1000 operates in a normal mode, the test operation signal BIE has a low level.

When the semiconductor memory device 1000 performs a write operation in a normal mode, the semiconductor memory device 1000 selects only one word line and one column select line connected to the memory cell to be written to, e.g., the first word line WL0 and the first column select line CSL0 connected to a memory cell to which data is to be written, and enables the first word line WL0 and the first column select line CSL0 and disables other word lines and column select lines. In order to store data '0' in the selected memory cell, a first write voltage $V_{W1}$ having a level higher than that of the reference source line voltage $V_{W2}$ is supplied to a bit line BL connected to the selected memory cell. Also, in order to store data '1', a second write voltage $V_{W3}$ having a level lower than that of the reference source line voltage $V_{W2}$ is supplied to the bit line BL connected to the selected memory cell. In this case, the reference source line voltage $V_{W2}$ is constantly applied to the source line SL irrespective of the occurrence of a write operation.

When the semiconductor memory device 1000 performs a write operation in a burn-in test mode, the test operation signal BIE having a high level is input. During a burn-test operation, data is written to all of the memory cells 111 of the cell array 110, or to memory cells of a specific region of the cell array 110. When data is written to all of the memory cells 111, all of the word lines WL0 through WLN and all of column select lines CSL0 through CSLM are selected and enabled.

In order to apply a stress higher than the stress used when data '0' is written to a memory cell in a normal mode, the first write voltage $V_{W1}$ having a level higher than that of the reference source line voltage $V_{W2}$ is supplied to the bit line BL, and the first source line voltage $V_{W2}-\Delta$ having a level lower by a predetermined value than that of the reference source line voltage $V_{W2}$ is supplied to the source line SL.

Also, in order to apply a stress higher than that the stress used when data '1' is written in a normal mode, the second write voltage $V_{W3}$ having a level lower than that of the reference source linen voltage $V_{W2}$ is supplied to the bit line BL, and the second source line voltage $V_{W2}+\Delta$ having a level higher by a predetermined value than that of the reference source line voltage $V_{W2}$ is supplied to the source line SL.

The same bias is simultaneously applied to all of the memory cells 111 in a burn-in test mode in the above embodiment, e.g., so testing time may be reduced. However, according to other embodiments of the inventive concept, the cell array 110 may be divided into a plurality of regions according to a stress pattern, a current supply capability of a tester, and a capability of a transistor in a chip to drive a current and a burn-in test may be sequentially performed according to the regions. In this case, the burn-in test decoder 150 of the semiconductor memory device 1000 of FIG. 1 may select word lines and bit lines of a region to be tested.

Figure 11:
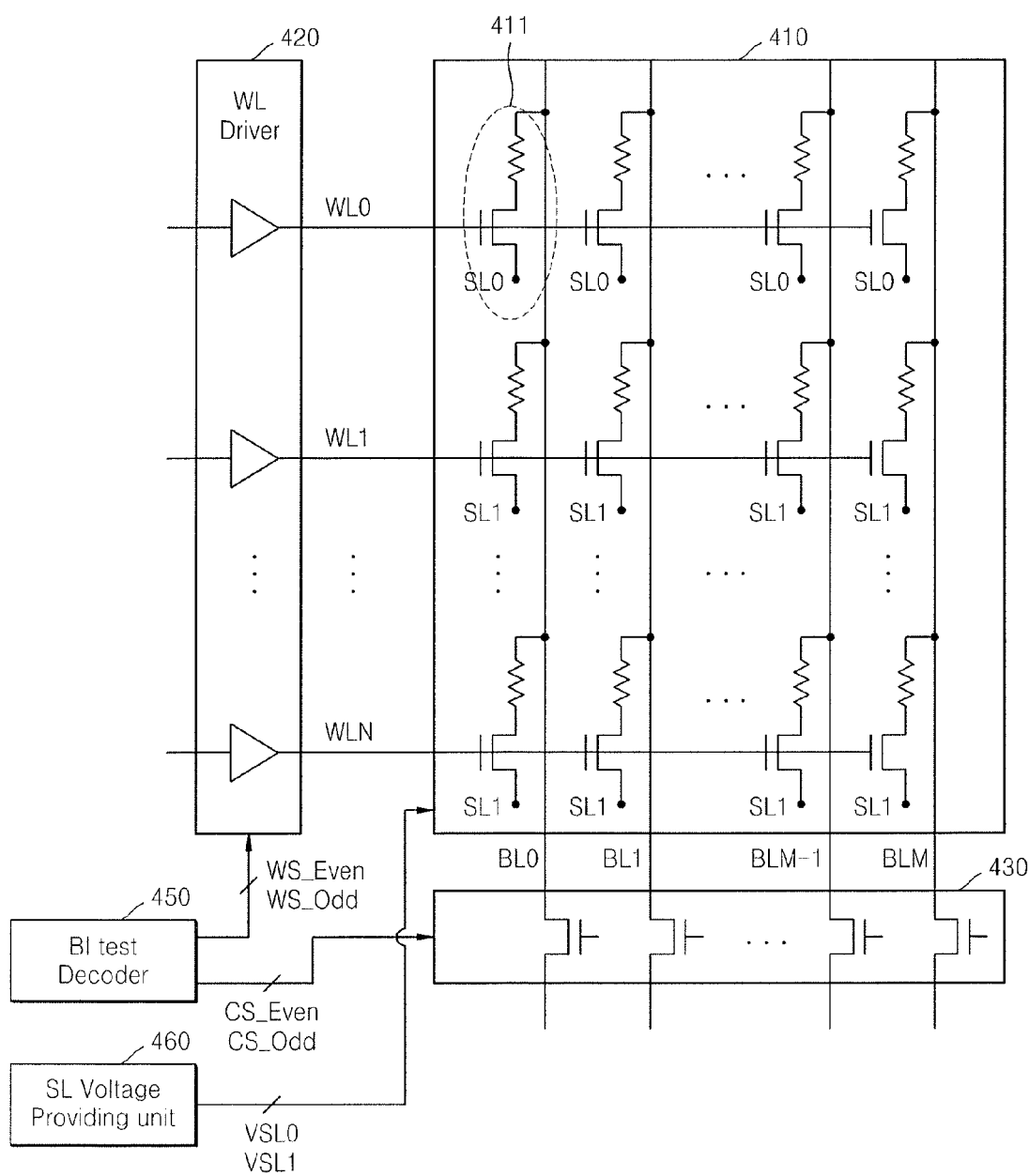
FIG. 11 illustrates a block diagram of a semiconductor memory device according to another embodiment of the inventive concept.

FIG. 11 is a block diagram illustrating a semiconductor memory device 400 according to another embodiment of the inventive concept. In FIG. 11, a cell array 410 is divided into at least two regions, and a burn-in test is performed according to the regions.

The semiconductor memory device 400 may include the cell array 410, a row decoder 420, a column decoder 430, a burn-in test decoder 450, and a source line voltage supply unit 460. The cell array 410 includes a plurality of memory cells 411, and each of the memory cells 411 is connected to any one of a plurality of source lines SL0 and SL1. In FIG. 11, the plurality of word lines WL0 through WLN are divided into even word lines WL0, WL2, . . . and odd word lines WL1, WL3, . . . , and memory cells corresponding to the even word lines WL0, WL2, . . . are connected to the first source line SL0 and memory cells corresponding to the odd word lines WL1, WL3, . . . are connected to the second source line SL1. Although not shown in FIG. 11, the bit lines BL0 through BLM may be divided into even bit lines BL0, BL2, . . . and odd bit lines BL1, BL3, . . . , and memory cells corresponding to the even bit lines BL0, BL2, . . . are connected to the first source line SL0 and memory cells corresponding to the odd bit lines BL1, BL3, . . . are connected to the second source line SL1.

A burn-in test may be performed according to the regions of the cell array 410. For example, the cell array 410 may be divided into two regions, i.e., first and second regions. The first region may be a region including the memory cells corresponding to the even word lines WL0, WL2, . . . and the second region may be a region including the memory cells corresponding to the odd word lines WL1, WL3, . . . .

During a burn-in test operation, the burn-in test decoder 450 generates word line select signals WS_Even and WS_Odd for selecting the word lines WL0 through WLN and applies the word line select signals WS_Even and WS_Odd to the row decoder 420, and generates column select signals CS_Even and CS_Odd for selecting the bit lines BL0 through BLM and applies the column select signals CS_Even and CS_Odd to the column decoder 430. A region of the cell array 410 is selected in response to the word line select signals WS_Even and WS_Odd and the column select signals CS_Even and CS_Odd and a burn-in test is performed in the selected region. The source line voltage supply unit 460 generates source line voltages VSL0 and VSL1 supplied to the selected region and unselected regions, and supplies the source line voltages VSL0 and VSL1 to the first and second source lines SL0 and SL1.

Although the cell array 410 is divided into two regions according to even and odd word lines in FIG. 11, the present embodiment is not limited thereto. For example, the cell array 410 may be divided into four regions according to even and odd word lines and even and odd bit lines. In this case, four different source lines may be disposed in the cell array 410. In this case, the source line voltage supply unit 460 may generate four source line voltages.

FIG. 12 is a table showing levels of voltages when the semiconductor memory device 400 of FIG. 11 operates in a burn-in test mode. In FIG. 12, (a) shows levels of voltages when the even word lines WL0, WL2, . . . are selected and a burn-in test is performed, and (b) shows levels of voltages when the odd word lines WL1, WL3, . . . are selected and a burn-in test is performed.

First, when the even word lines WL0, WL2, . . . are selected and data '0' is written in a burn-in test mode, the cell transistor is turned on by supplying the logic high voltage $V_S$ to the even word lines WL0, WL2, . . . . Also, in order to apply a stress higher than the stress used when data '0' is written in a normal mode, the first write voltage $V_{W1}$ is supplied to the selected bit line SEL BL, and the first source line voltage $V_{W2}-\Delta$ having a level lower by a predetermined value than that of the reference source line voltage $V_{W2}$ is supplied to the first source line SL0. A voltage having the same level as that of the first source line voltage $V_{W2}-\Delta$ may be supplied to the unselected bit line UNSEL BL, and the reference source line voltage $V_{W2}$ may be supplied to the second source line SL1.

When data '1' is written in a burn-in test mode, the second write voltage $V_{W3}$ having a low level (for example, a ground voltage) is supplied to the selected bit line SEL BL, and the second source line voltage $V_{W2}+\Delta$ having a level higher by a predetermined value than that of the reference source line voltage $V_{W2}$ is supplied to the first source line SL0. Also, a voltage having the same level as that of the second source line voltage $V_{W2}+\Delta$ may be supplied to the unselected bit line UNSEL BL, and the reference source line voltage $V_{W2}$ may be supplied to the second source line SL1.

As described above, a burn-in test is performed in a region of the cell array 410 and then a burn-in test operation is performed in another region. For example, as shown in (b) of FIG. 12, the odd word lines WL1, WL3, . . . may be selected and a burn-in test may be performed.

A burn-in test for the odd word lines WL1, WL3, . . . may be performed in a similar manner. When data '0' is written in a burn-in test mode, the cell transistor is turned on by supplying the logic high voltage $V_S$ to the odd word lines WL1, WL3, . . . . The first write voltage $V_{W1}$ is supplied to the selected bit line SEL BL and the first source line voltage $V_{W2}-\Delta$ having a level lower by a predetermined value than that of the reference source line voltage $V_{W2}$ is supplied to the second source line SL1. Also, when data '1' is written in a burn-in test mode, the second write voltage $V_{W3}$ having a low level (for example, a ground voltage) is supplied to the selected bit line SEL BL and the second source line voltage $V_{W2}+\Delta$ having a level higher by a predetermined value than that of the reference source line voltage $V_{W2}$ is supplied to the second source line SL1.

Figure 13:
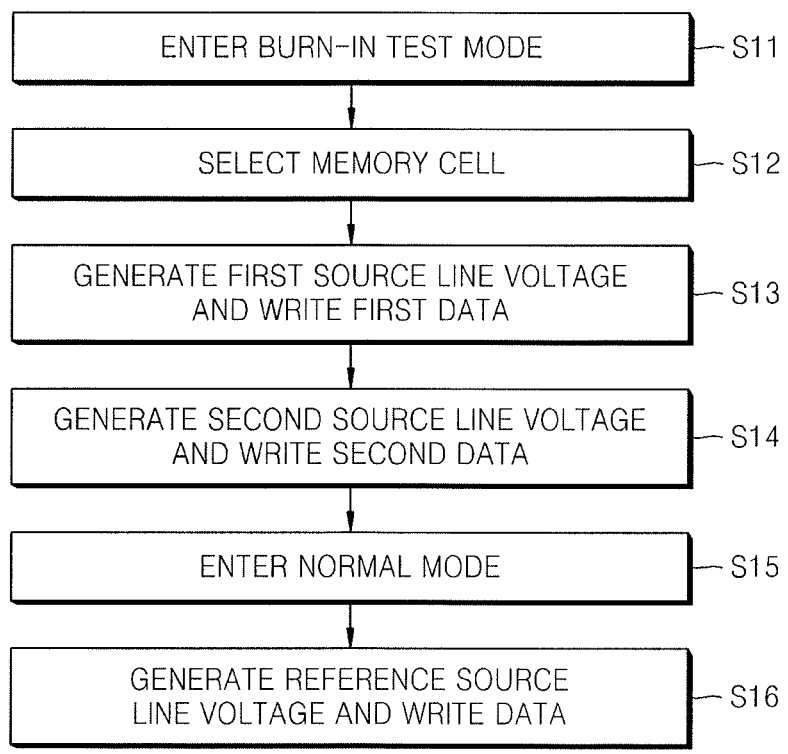
FIG. 13 illustrates a flowchart of a method of performing a burn-in test on a semiconductor memory device, according to an embodiment of the inventive concept.

FIG. 13 is a flowchart illustrating a method of performing a burn-in test on a semiconductor memory device, according to an embodiment of the inventive concept.

Referring to FIG. 13, in operation S11, when a test operation signal is input from an external tester or a test command is generated from a MRS in the semiconductor memory device, the semiconductor memory device enters a burn-in test mode. In operation S12, in the burn-in test mode, a word line select signal and a bit line select signal for selecting memory cells in a burn-in test decoder are generated and memory cells of at least one region of a cell array are selected in response to the word line select signal and the bit line select signal.

Various voltages for performing a memory operation on the selected memory cell are generated. In the burn-in test mode, a memory cell with a risk of malfunction may be detected early, e.g., before the semiconductor memory device is placed in service, by applying for a short time a stress higher than the stress used during normal operation to the semiconductor memory device, and levels of the various voltages for performing the memory operation are set in consideration of the detected memory cell with the risk of malfunction. For example, when data '0' or '1' is written, a write operation is performed by applying a stress higher than that used in a respective normal mode.

In the burn-in test mode, first data (for example, data '0') and second data (for example, data '1') are written. In operation S13, a first source line voltage is generated and the first data is written by supplying the first source line voltage to the cell array. The first source line voltage has a level lower by a predetermined value than that of a reference source line voltage supplied to a source line in a normal mode. In operation S14, a second source line voltage is generated and the second data is written by supplying the second source line voltage to the cell array.

In operation S15, when the burn-in test is completed by applying a stress, the semiconductor memory device enters a normal mode. In the normal mode, the semiconductor memory device performs a memory operation such as a write or read operation. For example, in operation S16, a reference source line voltage for a write operation is generated, and a write operation is performed by using the reference source line voltage.

Figure 14:
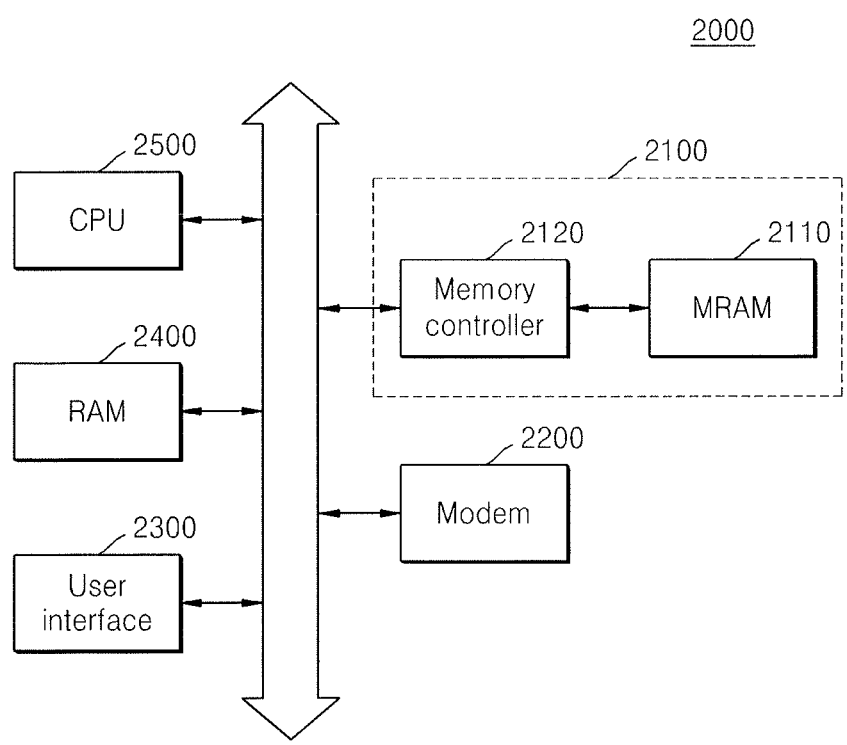
FIG. 14 illustrates a block diagram of an information processing system including a semiconductor memory device, according to an embodiment of the inventive concept.

FIG. 14 is a block diagram illustrating an image processing system 2000 including a semiconductor memory device 2110, according to an embodiment of the inventive concept. Referring to FIG. 14, a memory system 2100 including the semiconductor memory device 2110 may be provided in the information processing system 2000, e.g., a mobile device or a desktop computer. The information processing system 2000 may include the memory system 2100, a modem 2200, a central processing unit (CPU) 2500, a RAM 2400, and a user interface 2300 electrically connected to a system bus 2600. Also, the memory system 2100 may be a nonvolatile memory system including a nonvolatile memory. For example, the memory system 2100 includes the semiconductor memory device 2110 that is, for example, an MRAM, and a memory controller 2120.

Data processed by the CPU 2500 or data input from the outside is stored in the memory system 2100. The semiconductor memory device 2110 may include any one of, e.g., a flash memory and a nonvolatile memory such as an MRAM, a PRAM, an RRAM, and an FRAM. Also, the RAM 2400, which is a memory for temporarily storing data, may be a volatile memory device such as a dynamic RAM (DRAM), but the present embodiment is not limited thereto and may be the same memory as a memory device included in the memory system 2100. Although not shown in FIG. 11, it will be understood by one of ordinary skill in the art that the information processing system 2000 may be further provided with, e.g., an application chipset, a camera image sensor (CIS), or an input/output device.

While the inventive concept has been particularly shown and described with reference to exemplary embodiments thereof, they are provided for the purposes of illustration and it will be understood by those of ordinary skill in the art that various modifications and equivalent other embodiments can be made from the inventive concept. Accordingly, the true technical scope of the inventive concept is defined by the technical spirit of the appended claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a cell array having a plurality of memory cells, each memory cell including a resistive element and a cell transistor between a bit line and a source line; and
a source line voltage supply unit configured to supply a reference source line voltage, a first source line voltage, and a second source line voltage,
wherein, in a normal mode, the source line voltage supply unit supplies the reference source line voltage to the source line,
wherein, in a test mode, the source line voltage supply unit supplies the first source line voltage to the source line when data in a first state is recorded and the second source line voltage to the source line when data in a second state is recorded, and
wherein the first source line voltage is lower than the reference source line voltage and the second source line voltage is higher than the reference source line voltage.

2. The semiconductor memory device as claimed in claim 1, wherein the memory cells include magnetic tunnel junction (MTJ) cells.

3. The semiconductor memory device as claimed in claim 2, wherein the test mode is a burn-in test mode.

4. The semiconductor memory device as claimed in claim 1, wherein the cell array includes a plurality of regions, the source line voltage supply unit being configured to supply source line voltages having different levels to the plurality of regions in the test mode.

5. The semiconductor memory device as claimed in claim 1, wherein, in the test mode, the source line voltage supply unit supplies source line voltages having a same level to the plurality of memory cells of the cell array.

6. The semiconductor memory device as claimed in claim 1, further comprising:
a row decoder configured to drive a word line connected to the memory cell in response to a first select signal;
a column decoder configured to select the bit line in response to a second select signal; and
a burn-in test decoder that, in the test mode, is configured to generate the first and second select signals for testing the memory cells.

7. The semiconductor memory device as claimed in claim 6, wherein all of the plurality of memory cells of the cell array are simultaneously selected in response to the first and second select signals.

8. The semiconductor memory device as claimed in claim 6, wherein the cell array includes a plurality of regions, memory cells of the plurality of regions are sequentially selected in response to the first and second select signals.

9. The semiconductor memory device as claimed in claim 1, wherein the source line voltage supply unit includes:
a first voltage generator configured to output the reference source line voltage;
a second voltage generator configured to output the first source line voltage or the second source line voltage according to a data write state; and
a switching unit configured to selectively supply any one of outputs of the first and second voltage generators to the source line in response to a test operation signal.

10. The semiconductor memory device as claimed in claim 1, wherein the source line voltage supply unit includes:
a voltage divider configured to generate a plurality of divided voltages through voltage division, and to output any one divided voltage in response to a test operation signal and at least one control signal; and a voltage controller configured to receive the divided voltage, to output a source line voltage to the source line, and to adjust and output the source line voltage according to a level difference between the divided voltage and the source line voltage.

11. A method of performing a burn-in test on a semiconductor memory device having a cell array with a plurality of memory cells, each of the memory cells including a resistive element, the method comprising:
   entering a burn-in test mode in response to a test operation signal;
   selecting at least one memory cell of the cell array by using a burn-in test decoder;
   supplying a first source line voltage lower than a reference source line voltage to a source line, such that data in a first state is written to the at least one selected memory cell; and
   supplying a second source line voltage higher than the reference source line voltage to the source line, such that data in a second state is written to the at least one selected memory cell.

12. The method as claimed in claim 11, wherein, in a normal mode, the reference source line voltage is supplied to the source line in order to write data in the first state and the second state.

13. The method as claimed in claim 11, further comprising, when the semiconductor memory device operates in a normal mode, commonly supplying the reference source line voltage to the plurality of memory cells of the cell array through the source line.

14. The method as claimed in claim 11, wherein the memory cells include magnetic tunnel junction (MTJ) cells.

15. The method as claimed in claim 11, wherein, in a burn-in test mode, the plurality of memory cells of the cell array are simultaneously selected by using the burn-in test decoder.

16. The method as claimed in claim 11, wherein the cell array includes a plurality of regions, the plurality of regions of the cell array being sequentially selected in the burn-in test mode by using the burn-in test decoder.

* * * * *